United States Patent [19]

Tomisawa

[11] Patent Number: 4,988,960

[45] Date of Patent: Jan. 29, 1991

[54] FM DEMODULATION DEVICE AND FM MODULATION DEVICE EMPLOYING A CMOS SIGNAL DELAY DEVICE

[75] Inventor: Norio Tomisawa, Hamamatsu, Japan

[73] Assignee: Yamaha Corporation, Hamamatsu, Japan

[21] Appl. No.: 447,781

[22] Filed: Dec. 8, 1989

Related U.S. Application Data

[60] Division of Ser. No. 289,479, Dec. 21, 1988, which is a continuation of Ser. No. 760,332, Jul. 29, 1985, abandoned.

[51] Int. Cl.$^5$ .................. H03C 3/09; H03D 3/06; H03K 3/354; H03L 7/099
[52] U.S. Cl. .................. 332/127; 329/325; 329/326; 329/336; 331/2; 331/8; 331/25; 331/34; 331/57; 332/135
[58] Field of Search .................. 331/2, 8, 10, 25, 34, 331/57; 332/127, 128, 135; 329/336, 325, 326; 455/42, 75, 110, 119, 214, 260

[56] References Cited

U.S. PATENT DOCUMENTS

| | | | |
|---|---|---|---|
| 3,931,588 | 1/1976 | Gehweiler | 331/57 |
| 4,072,910 | 2/1978 | Dingwall et al. | 331/57 |
| 4,131,861 | 12/1978 | Malaviya | 331/2 |
| 4,494,021 | 1/1985 | Bell et al. | 331/57 X |
| 4,567,448 | 1/1986 | Ikeda | 331/25 |
| 4,603,301 | 7/1986 | Dukes et al. | 329/336 |

Primary Examiner—Siegfried H. Grimm
Attorney, Agent, or Firm—Spensley Horn Jubas & Lubitz

[57] ABSTRACT

A signal delay device comprises a CMOS gate circuit having an input terminal to which a binary input signal to be delayed is applied, an output terminal from which a delayed signal is derived and power voltage supply terminals to which operation power voltages are applied. The delay time of the CMOS gate circuit depends upon voltage applied to it and, utilizing this phenomenon, voltage control means is provided in a power supplying path for the CMOS gate circuit for controlling voltage applied to the CMOS gate circuit. The signal delay device using the CMOS gate circuit is applied to various circuits including a FM modulator or FM demodulator. The signal delay device will assure undistorted signals.

6 Claims, 10 Drawing Sheets

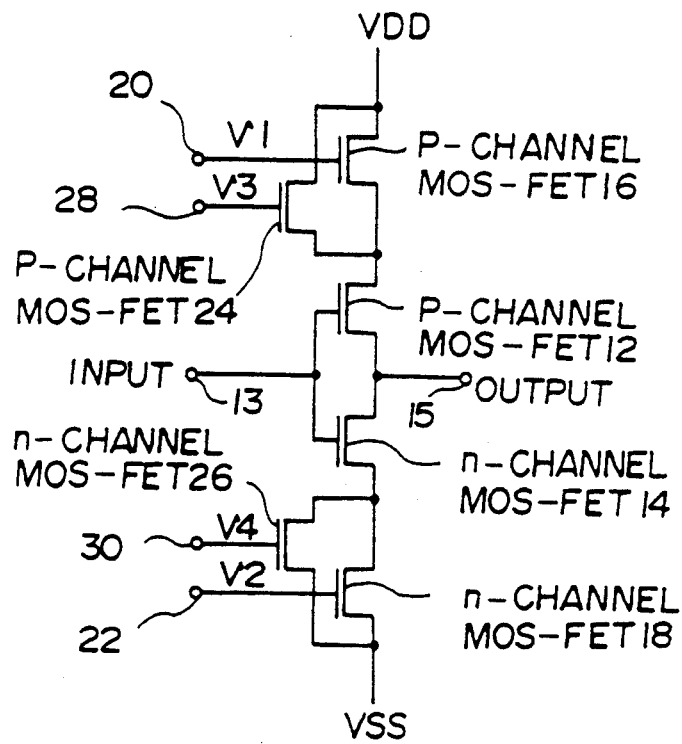
F I G. 7
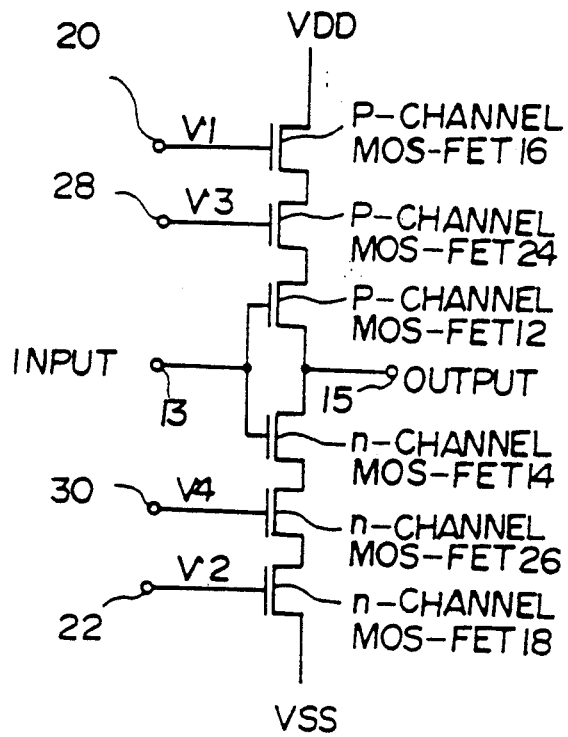
F I G. 8

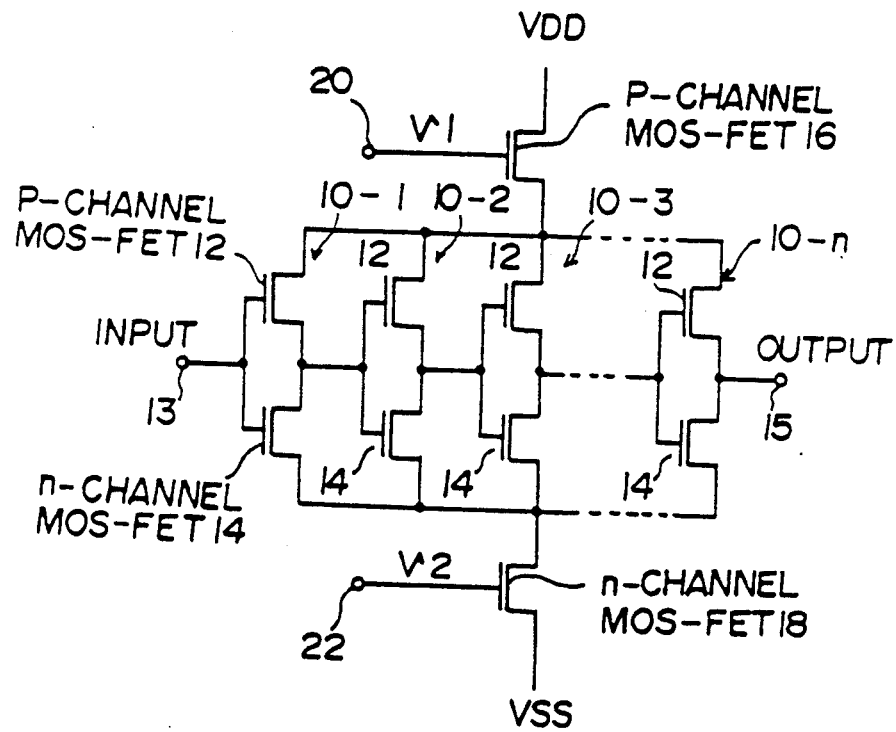
F I G. 9
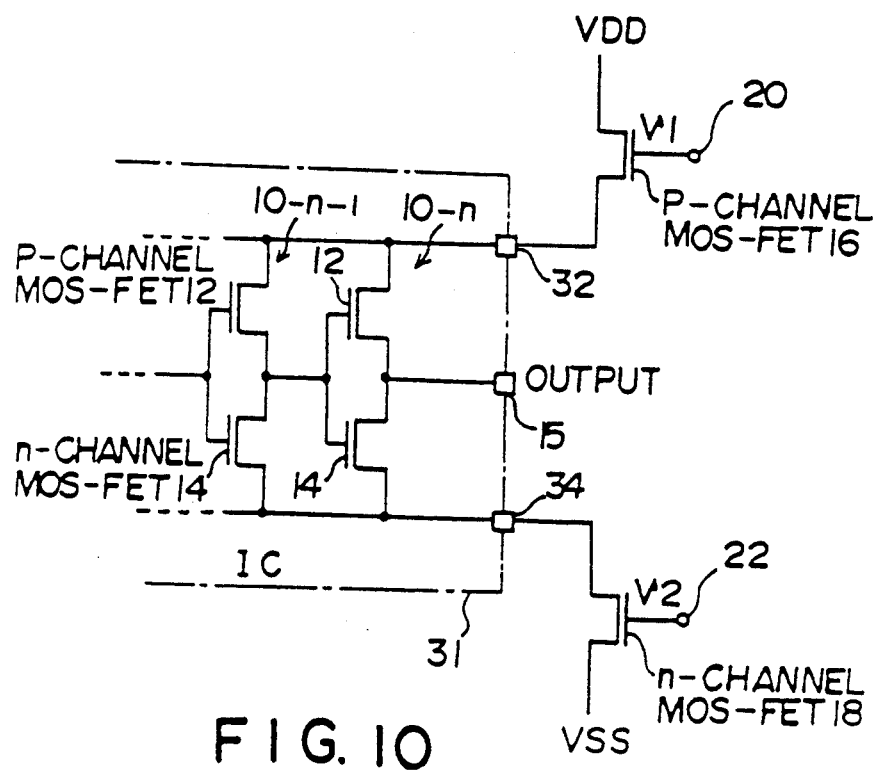
F I G. 10

FM DEMODULATION DEVICE AND FM MODULATION DEVICE EMPLOYING A CMOS SIGNAL DELAY DEVICE

This is a division of application Ser. No. 289,479, filed on Dec. 21, 1988, which is a continuation of Ser. No. 760,332, filed July 29, 1985, now abandoned.

BACKGROUND OF THE INVENTION

This invention relates to a signal delay device a delay time of which can be controlled easily.

Known in the art of a signal delay circuit are various circuits such, for example, as a physical delay line, a distributed constant circuit, a bucket-brigade device (BBD), a charge-coupled device (CCD), and a shift register and a program control utilizing a random-access memory (RAM) in a digital system.

In various circuits to which a signal delay circuit is applied, there is a technical demand for arbitrarily varying a delay time of the delay circuit. Such arbitrary variation of the delay time can hardly be achieved by a delay line or a distributed constant circuit and, for this purpose, a bucket-brigade device, a charge-coupled device, a shift register or like device which uses a clock pulse for transmission of a signal is generally employed to control the frequency of the clock pulse.

In such delay system utilizing a clock pulse for transmission of a signal, a signal is sampled by a clock pulse and, accordingly, resolution of the system along the time axis is determined by the clock period. As a result, in a case where, for example, a pulse frequency modulation signal containing analog data along the time axis is to be delayed, a phase error tends to occur in the delay output. This defect can theoretically be eliminated by employing a very fast clock and thereby improving the resolution. This requires, however, increase in the number of stages of a delay element such as a bucket-brigade device, a charge-coupled device or a shift register with resulting difficulties in the circuit design and increase in the manufacturing costs.

It is, therefore, a first object of the invention to provide a signal delay device a delay time of which can be readily controlled without causing a phase error.

For achieving this object, the invention utilizes the phenomena that a CMOS gate has a delay time between its input and output terminals and this delay time changes depending upon voltage applied thereto.

The delay time of the CMOS gate depends upon power voltage and temperature. The smaller the power voltage, the longer the delay time and the larger the rate of change. As to the temperature, the higher the temperature, the longer the delay time. This is because conductance of the element of the CMOS gate changes due to the power voltage and temperature. Since dependency of the delay time upon the power voltage and temperature is too large to be ignored and influences of these factors are observed as instability in the oscillation period in an oscillation circuit and increase in distortion in the transmission system, it has been difficult to use the CMOS gate as a delay circuit in a circuit which requires a precision control. For overcoming such difficulty, it is conceivable to use a strictly stabilized power source and provide the CMOS gate in a thermostatic oven. This will however require a bulky and costly circuitry.

It is, therefore, a second object of the invention to provide a delay time stabilizing circuit capable of accurately stabilizing the delay time of the delay circuit utilizing the CMOS gate with a simple construction.

The above described delay circuit utilizing the CMOS gate is applicable to various circuits and devices. One of them is an analog delay circuit.

As described above, the prior art analog delay circuit using a bucket-brigade device, a charge-coupled device, a shift register or the like device uses a clock pulse for transmitting a signal. Since a signal is sampled by a clock pulse in this type of delay circuit, resolution in the time axis is determined by the clock period with a result that the distortion factor increases. Further, although the delay time can be changed by changing the clock period in this type of delay circuit, resolution also is caused to change with the change of the clock period.

It is, therefore, a third object of the invention to provide an analog delay circuit capable of delaying an analog signal with a high resolution and a low distortion factor and also capable of changing the delay time continuously without changing the resolution by employing the delay circuit using the CMOS gate.

SUMMARY OF THE INVENTION

The first object of the invention is achieved by providing a voltage control means for controlling voltage applied to a CMOS gate circuit between the gate circuit and its power sources so that the signal delay time between an input terminal and an output terminal of the gate circuit can be controlled by this voltage control means.

According to the invention, by utilizing the phenomena that the CMOS gate has a delay time between its input and output terminals and that the delay time changes depending upon applied voltage, the delay time can be readily controlled by changing applied voltage. Besides, since an original signal is not transmitted through sampling by a clock pulse as in the prior art delay circuits using the bucket-brigade device, charge-coupled device, shift register and the like but is continuously delayed in its original form, any signal including one having analog data along the time axis such as a pulse frequency modulation signal can be delayed without causing a phase error.

The second object of the invention is achieved by providing means for producing an analog voltage corresponding to the delay time of the CMOS gate circuit and means for supplying this voltage as operation voltage for the CMOS gate circuit thereby to stabilize the delay time of the CMOS gate circuit.

According to this delay time stabilizing circuit, the delay time can be stabilized readily and accurately without using a strictly stabilized power source and a thermostatic oven.

The third object of the invention is achieved by providing an analog delay circuit which comprises a frequency modulation circuit for pulse frequency-modulating an input analog signal, a delay circuit using a CMOS gate for delaying an output signal of the frequency modulation circuit and a frequency demodulation circuit for frequency-demodulating an output signal of the delay circuit.

According to this analog delay circuit, a high resolution is realized since no clock is used for delaying of an analog signal and moreover a continuous control of the delay time is available by controlling the power voltage applied to the CMOS gate.

BRIEF DESCRIPTION OF THE DRAWINGS

In the accompanying drawings,

FIGS. 7 through 15 are respectively circuit diagrams showing other embodiments of the delay circuit according to the invention;

DESCRIPTION OF PREFERRED EMBODIMENTS

I. Delay Circuit utilizing a CMOS gate

Figure 2:
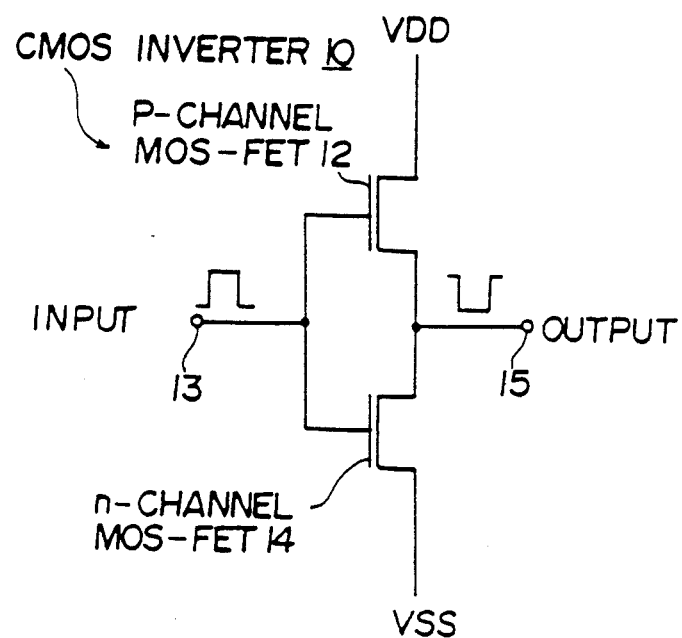
FIG. 2 is a circuit diagram showing a CMOS gate circuit.

An example of a CMOS gate is shown in FIG. 2. A p-channel MOS-FET 12 and an n-channel MOS-FET 14 are connected in their gates and drains together and power voltages $V_{DD}$-$V_{SS}$ are respectively applied to their sources. A signal is applied to their gates through an input terminal 13 and an inverted signal of the input signal is produced from an output terminal 15 through their drains.

Figure 3:
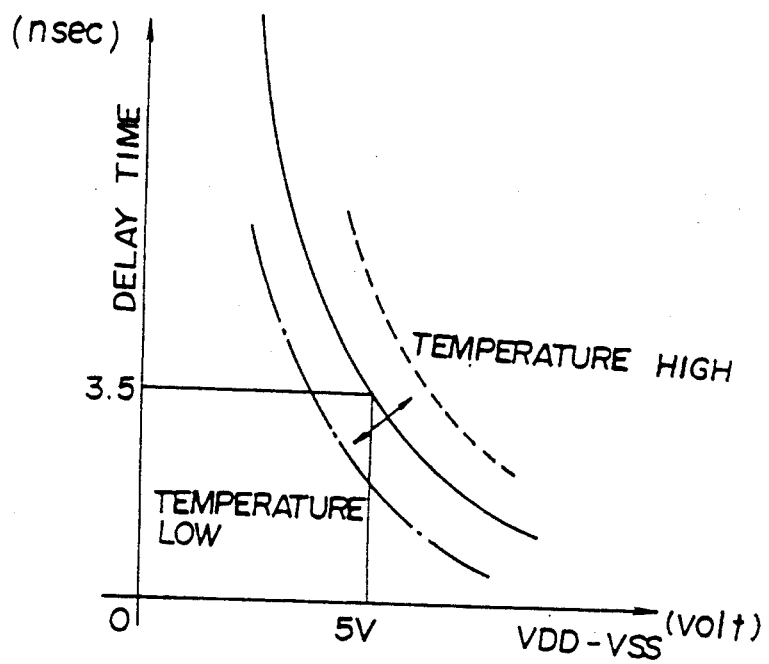
FIG. 3 is a diagram showing power voltage - delay time characteristics in the CMOS gate shown in FIG. 2.

In this CMOS inverter 10, there occurs a delay time between its input and output. This delay time depends, as shown in FIG. 3, upon the power voltage $V_{DD}$-$V_{SS}$. The smaller the power voltage $V_{DD}$-$V_{SS}$, the greater the delay time and the rate of change thereof. This is because conductance of the element changes depending upon the power voltage $V_{DD}$-$V_{SS}$. Accordingly, a desired length of delay time can be obtained by controlling the delay time in accordance with the magnitude of the power voltage $V_{DD}$-$V_{SS}$, utilizing the above described property.

Figure 4:
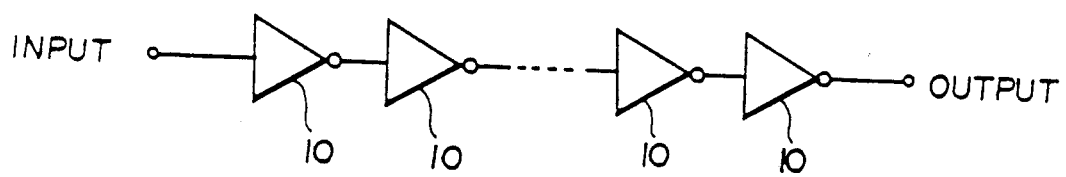
FIG. 4 is a circuit diagram showing a circuit capable of obtaining a long delay time by cascade-connecting CMOS inverters 10 of FIG. 2 in plural stages.
Figures 5, 6:
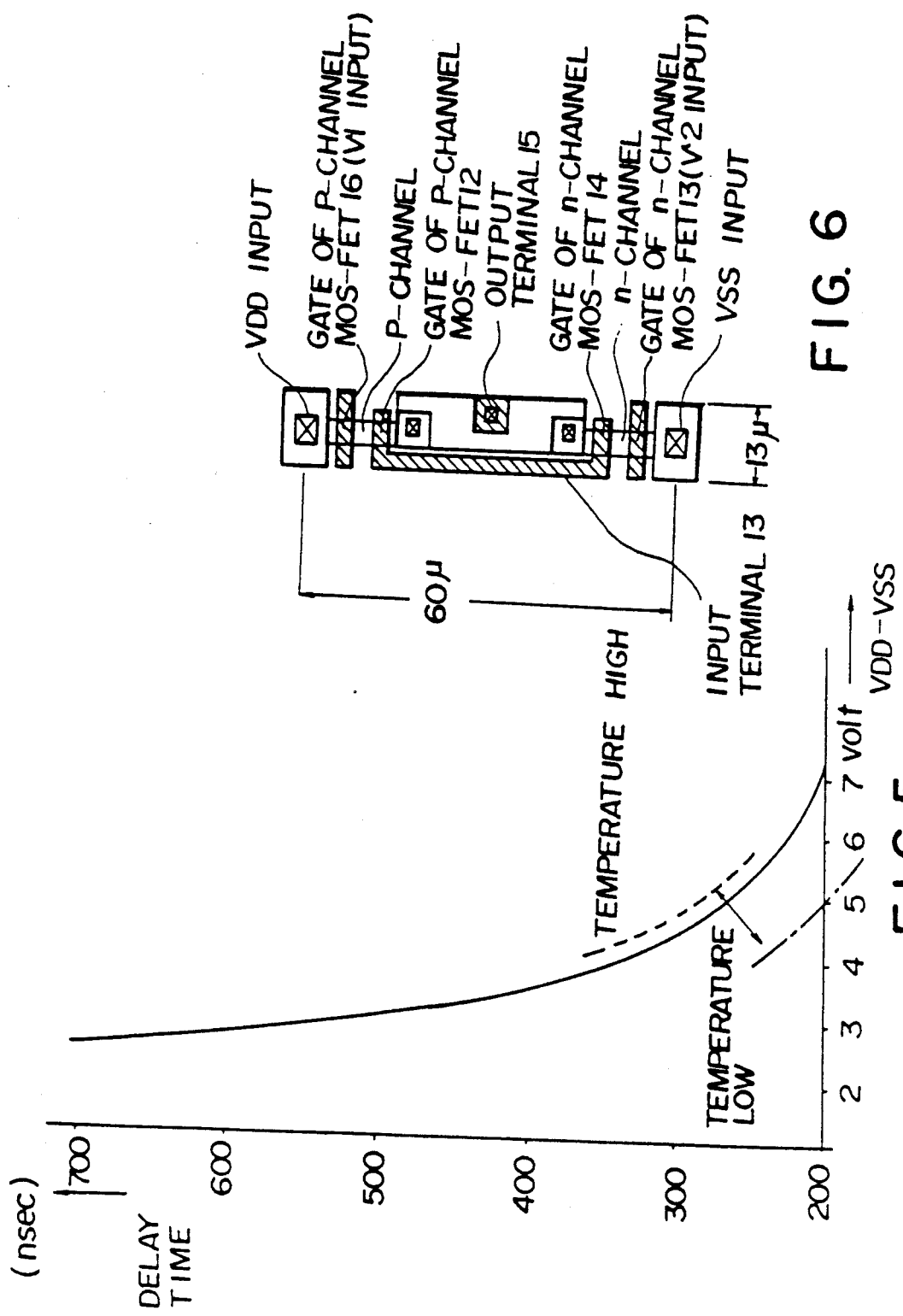
FIG. 5 is a diagram showing power voltage - delay time characteristics of a circuit in which the CMOS inverters 10 shown in FIG. 2 are cascade-connected in 80 stages.
FIG. 6 is an example of the circuit of FIG. 1 formed in an integrated circuit.

Further, if a plurality of the CMOS inverters 10 are cascade-connected as shown in FIG. 4, a longer delay time can be obtained. If, for example, delay time of about 3.5 (nsec) per stage is obtained at the power voltage $V_{DD}$-$V_{SS}$ of 5 (V) and the CMOS inverters 10 are connected in 8,000 stages, a delay time of 8,000×3.5 (nsec)≈28 (μsec) can be obtained. Power voltage $V_{DD}$-$V_{SS}$ v. delay time characteristics in case 80 CMOS inverters 10 are cascade-connected are shown in FIG. 5. It will also be noted from FIGS. 3 and 5 that the delay time of the CMOS inverter 10 depends also upon temperature, the delay time increasing as temperature rises to cause conductance change in elements.

Figure 1:
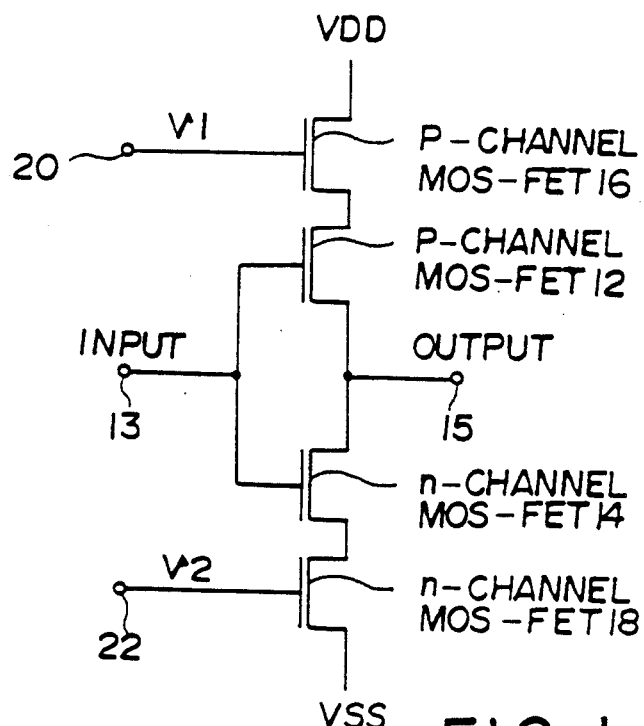
FIG. 1 is a circuit diagram showing an embodiment of the delay circuit according to the invention.

An embodiment of the invention is shown in FIG. 1. In this embodiment, delay time control elements are inserted between the CMOS gate and its power sources.

In FIG. 1, a p-channel MOS-FET 12 and an n-channel MOS-FET 14 are connected in their gates and drains together and a signal is applied to their gates and delivered out from their drains. A p-channel MOS-FET 16 and an n-channel MOS-FET 18 are inserted as delay time control elements between the source of the p-channel MOS-FET 12 and the power source $V_{DD}$ and between the source of the n-channel MOS-FET 14 and the power source $V_{SS}$. To the gates of the p-channel MOS-FET 16 and the n-channel MOS-FET 18 are applied control voltages v1 and v2 from terminals 20 and 22. These control voltages v1 and v2 are set at values which are symmetrical to the reference voltages $V_{DD}$-$V_{SS}$ (i.e., $V_{DD}$−v1=v2−$V_{SS}$). By controlling the values of the control voltages v1 and v2, voltages applied to the p-channel MOS-FET 12 and n-channel MOS-FET 14 which constitute the CMOS inverter are caused to change with resulting change in the delay time. The smaller the value of $V_{DD}$−v1=v2−$V_{SS}$, the greater the voltage applied to the MOS-FETs 12 and 14 and the smaller the delay time, while the greater the value of $V_{DD}$−v1=v2−$V_{SS}$, the smaller the voltage applied to the MOS-FETs 12 and 14 and the greater the delay time.

An example of the circuit of FIG. 1 formed in an integrated circuit pattern is shown in FIG. 6. By using this integrated circuit pattern, the multi-stage connection can be facilitated.

FIG. 7 shows an embodiment in which the delay time control elements are provided in two channels. In this embodiment, a p-channel MOS-FET 24 and an n-channel MOS-FET 26 are connected in parallel to the p-channel MOS-FET 16 and n-channel MOS-FET 18 in the circuit of FIG. 1. To the gates of the p-channel MOS-FET 24 and n-channel MOS-FET 26 are applied control voltages v3 and v4 from terminals 28 and 30. The delay time can be controlled in two systems by the voltages v1 and v2 from the terminals 20 and 22 and the voltages v3 and v4 from the terminals 28 and 30. This embodiment can be utilized in a case where, for example, coarse control signals are applied to the terminals 20 and 22 and fine control signals are applied to the terminals 28 and 30. The two channel control voltages may be separately applied by means of manual operation or control voltage generating circuit. This two channel control may be applied so that one channel is used for stabilization control of the delay time against the variations of the power voltages $V_{DD}$, $V_{SS}$ and the temperature, while the other channel is used for variable control of the delay time.

FIG. 8 shows an embodiment in which the p-channel MOS-FET 16 and the p-channel MOS-FET 24 on one hand and the n-channel MOS-FET 18 and n-channel MOS-FET 26 on the other are respectively connected in series. In this embodiment also, the delay time can be controlled in two channels by the voltages v1 and v2 applied to the terminals 20 and 22 and the voltages v3 and v4 applied to the terminals 28 and 30.

FIG. 9 shows an embodiment in which the invention is applied to CMOS inverters 10-1 through 10-n connected in plural stages. In these CMOS inverters, a drain output of a preceding stage is applied to a gate of a next stage. The power voltages $V_{DD}$ and $V_{SS}$ are supplied to the respective p-channel MOS-FET's 12 and the n-channel MOS-FET's 14 constituting the CMOS inverters 10-1 through 10-n via the p-channel MOS-FET 16 and the n-channel MOS-FET 18. According to this construction, the delay time can be controlled by the delay time control MOS-FET's 16 and 18.

FIG. 10 shows an embodiment in which the invention is applied to an arrangement of the CMOS inverters 10-1 through 10-n of plural stages formed in an integrated circuit 31. The delay time control elements are connected to the exterior of the integrated circuit 31. More specifically, the p-channel MOS-FET 16 and n-channel MOS-FET 18 are connected to power source terminals 32 and 34 which in turn are connected to the sources of the CMOS inverters 10-1 through 10-n and the power voltages $V_{DD}$ and $V_{SS}$ are applied to the CMOS inverters 10-1 through 10-n via the MOS-FET's 16 and 18.

Figure 11:
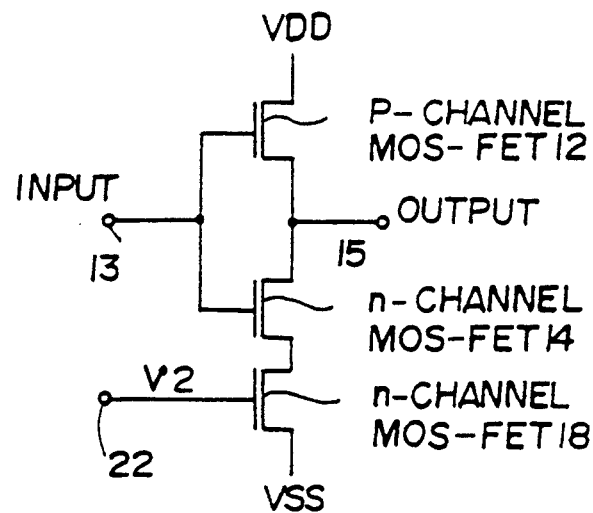

In the above described embodiments, the control elements are provided on both sides of the power sources. A similar effect can be obtained by providing the control element on one side only. FIG. 11 shows one example of such construction. This embodiment is equivalent to the embodiment of FIG. 1 except that the p-channel MOS-FET 16 is deleted. The delay time control is effected by the n-channel MOS-FET 18 only. Similarly, it is possible to delete the n-channel MOS-FET 18 in the embodiment of FIG. 1.

Figure 12:
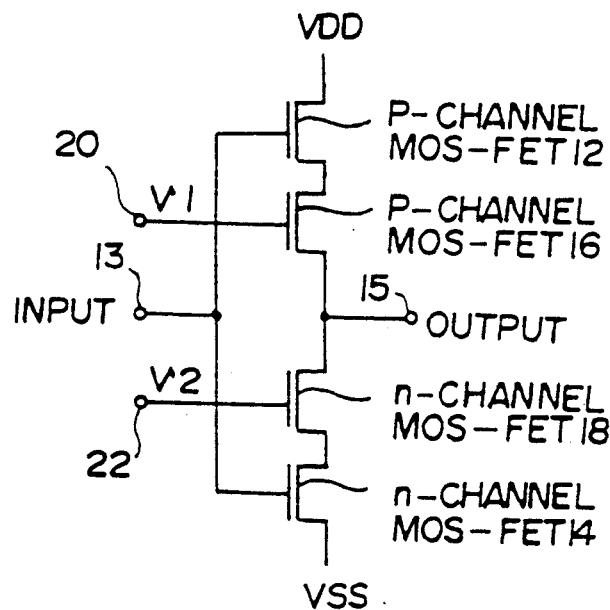

In the above described embodiments, the control elements are provided outside of the CMOS inverter. Alternatively, the control elements, however, may be provided inside of the CMOS inverter. FIG. 12 shows one example of such construction. In the construction of FIG. 12, the CMOS inverter is composed of the p-channel MOS-FET 12 and the n-channel MOS-FET 14 and the delay time control p-channel MOS-FET 16 and n-channel MOS-FET 18 are provided inside of this CMOS inverter.

Figure 13:
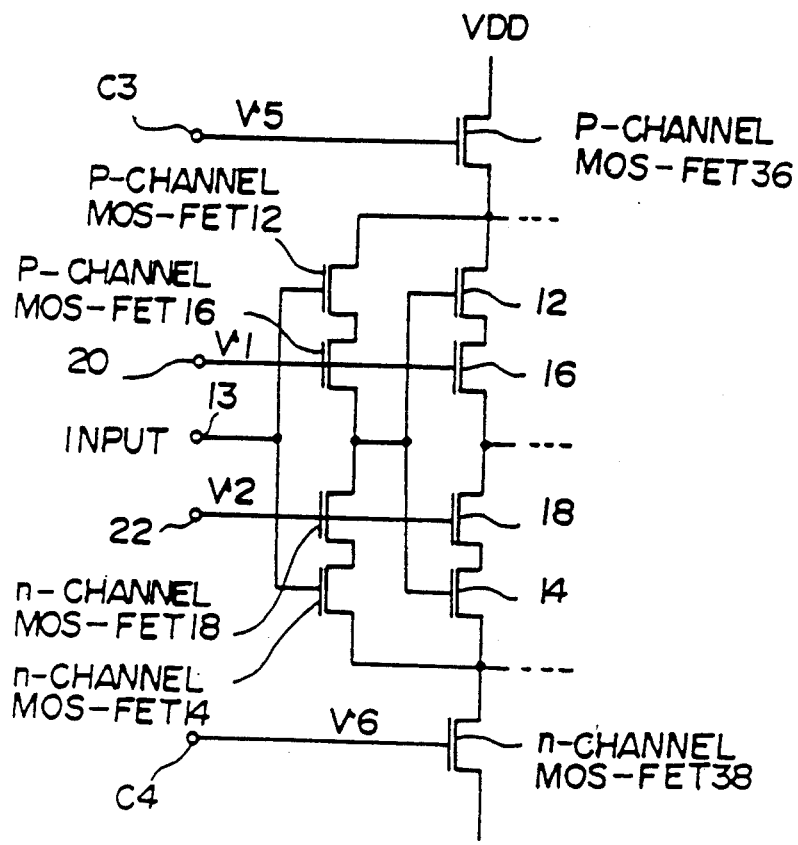

FIG. 13 shows an embodiment in which the circuits of FIG. 12 are connected in plural stages and the delay time control p-channel MOS-FET 36 and n-channel MOS-FET 38 are connected outside of these circuits. In this embodiment, the delay time is controlled by the two channels of voltages v1 and v2 applied to the gates of the MOS-FET's 16 and 18 and voltages v5 and v6 applied to the gates of the MOS-FET's 36 and 38 from terminals c3, c4.

Figure 14:
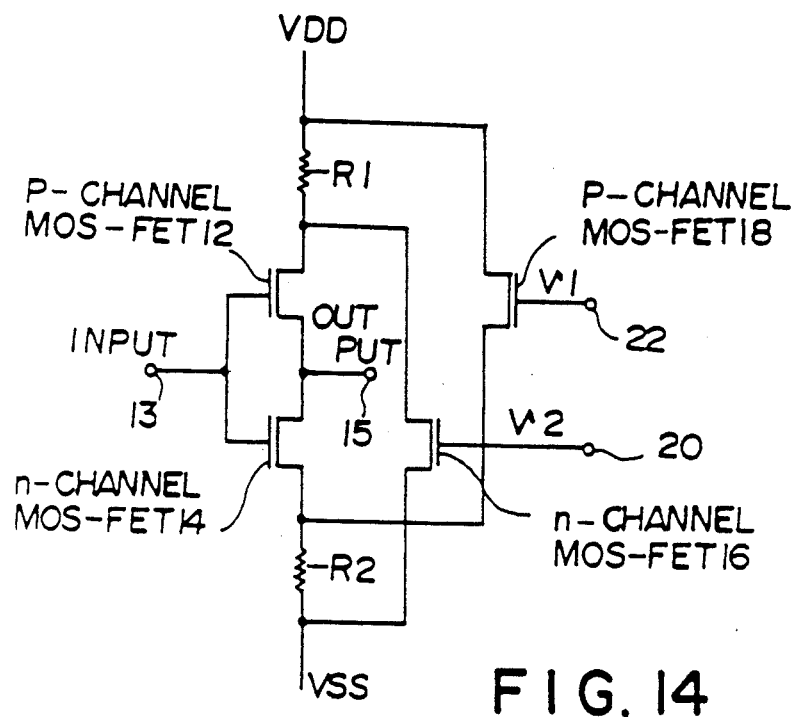

Instead of connecting the control elements to the MOS-FET's 12 and 14 constituting the CMOS inverter in series as in the foregoing embodiments, the control elements may be connected in parallel to these MOS-FET's. FIG. 14 shows one example of such construction. In FIG. 14, the sources of the p-channel MOS-FET 12 and n-channel MOS-FET 14 constituting the CMOS inverter are connected to the power source $V_{DD}$ and $V_{SS}$ via resistors R1 and R2, the delay time control n-channel MOS-FET 16 is connected in parallel to the p-channel MOS-FET 12, n-channel MOS-FET 14 and resistor R2, and the delay time control p-channel MOS-FET 18 is connected in parallel to the resistor R1, p-channel MOS-FET 12 and n-channel MOS-FET 14. The delay time is controlled by voltages v2 and v1 applied to the gates of the n-channel MOS-FET 16 and the p-channel MOS-FET 18. In this case, the relationship between change in the control voltages v1 and v2 and change in the delay time is reverse to the one in the embodiments of FIG. 13 and before.

Figure 15:
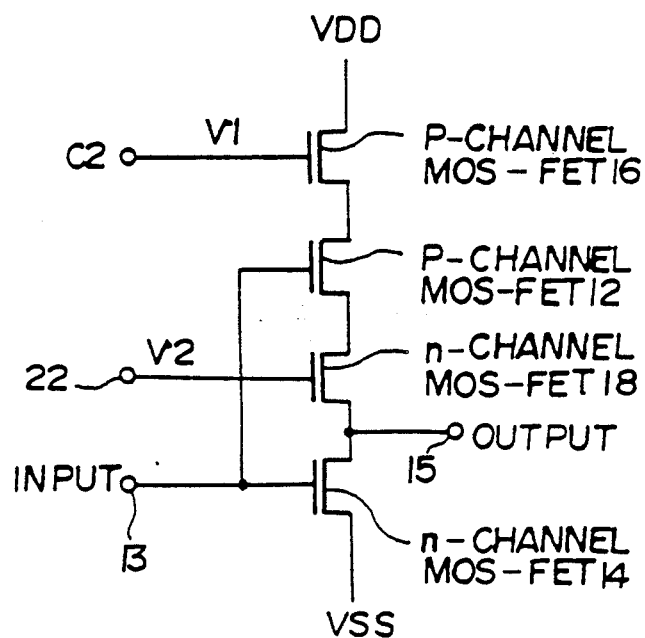

In the inverter shown in FIG. 15, a control n-channel MOS-FET 18 is inserted between MOS-FET's 12 and 14 constituting a CMOS inverter and a control p-channel MOS-FET 16 is inserted between the MOS-FET 12 and power source $V_{DD}$.

The delay time stabilizing circuit

Figure 16:
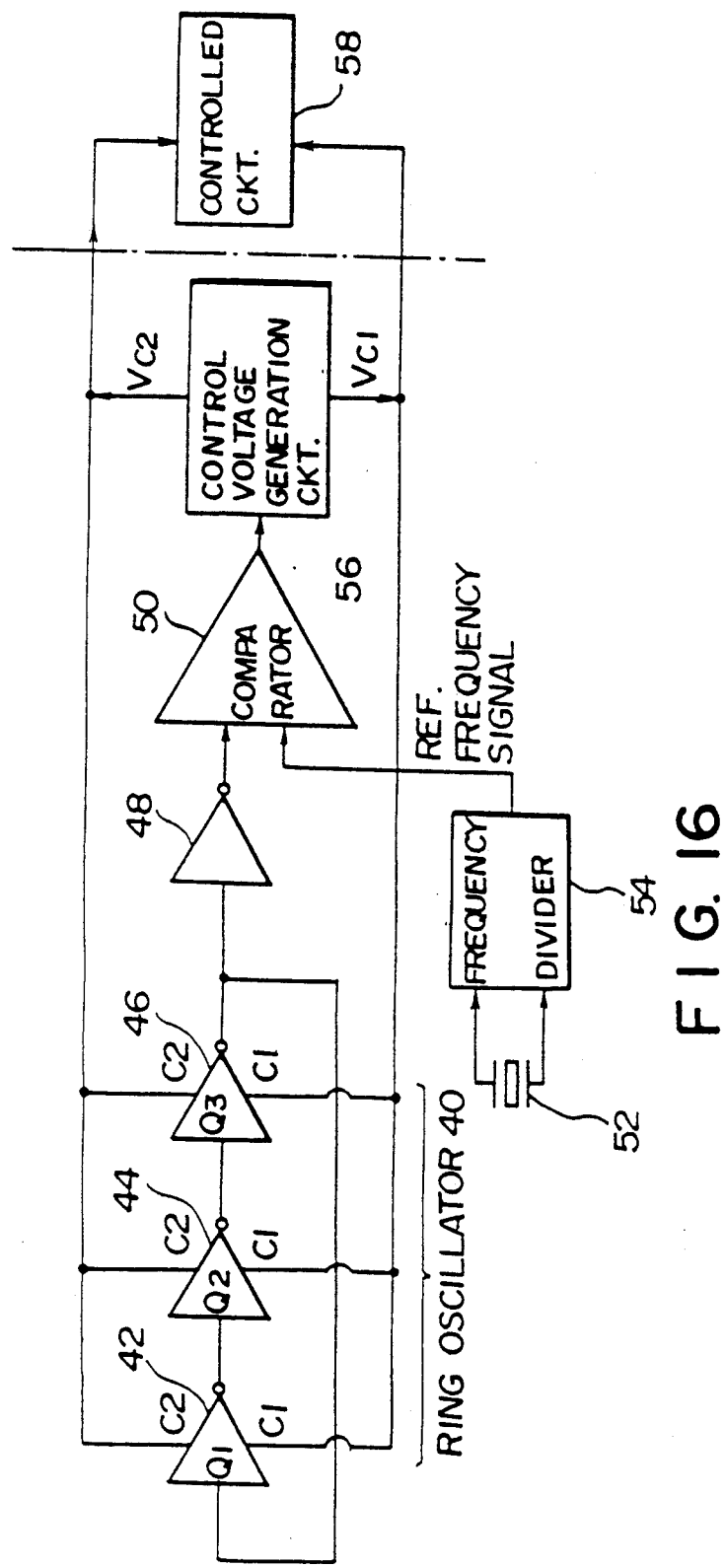
FIG. 16 is a circuit diagram showing an embodiment of the delay time stabilizing circuit according to the invention.

FIG. 16 shows an embodiment of the delay time stabilizing circuit according to the invention. This embodiment is designed for stabilizing the oscillation frequency of a ring oscillator and utilizing the control voltage used for this stabilization for stabilizing other circuits including a CMOS inverter.

In FIG. 16, a ring oscillator 40 utilizes delay characteristics of a CMOS inverter. Inverters 42, 44 and 46 of an odd number are cascade-connected and the output of the inverter 46 of the final stage is fed back to the inverter 42 of the initial stage. The oscillation frequency of the ring oscillator 40 is determined by the delay time of the open loop.

The oscillation output of the ring oscillator 40 is waveshaped by an inverter 48 and thereafter is applied to a comparator 50. The comparator 50 compares, in frequency and phase, this signal with a signal provided by frequency-dividing the output pulse of an oscillator 52 by a frequency divider 54 and produces a signal of a pulse width corresponding to the difference between the two signals.

In a control voltage generation circuit 56, DC voltages Vc1 and Vc2 are generated by smoothing the output pulse of the comparator 50. The DC voltages Vc1 and Vc2 are applied as control voltages to control input terminals c1 and c2 of the inverters 42, 44 and 46 which constitute the ring oscillator 40 to control the applied voltage thereof. Since delay characteristics of the inverters 42, 44 and 46 depend upon the applied voltages, a PLL (phase-locked loop) is constructed by constituting a negative feedback loop in the above described loop with a result that a very stable oscillation frequency can be produced by the ring oscillator 40. In other words, the inverters 42, 44 and 46 are controlled to a constant delay time regardless of variations of the power voltage and temperature. The respective CMOS inverters in FIG. 16 can be constructed as shown in FIGS. 1 and 7 through 15.

Besides the stabilization of the oscillation frequency of the ring oscillator 40, if the control voltages Vc1 and Vc2 obtained in the above circuit are supplied as control voltages to another circuit, i.e., a controlled circuit 58 including inverters which is provided in an environment (e.g., temperature) equivalent to the inverters 42, 44 and 46 (e.g., on the same substrate of an integrated circuit), delay characteristics of this controlled circuit 58 can also be stabilized. As the controlled circuit 58, those as shown in FIG. 17 through 20 may be conceived.

Figure 17:
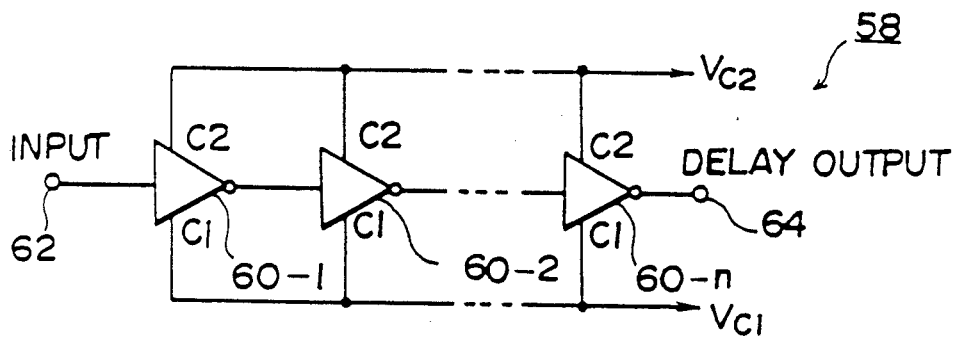
FIGS. 17 through 20 are circuit diagrams showing examples of controlled circuits 58 in FIG. 16.

FIG. 17 shows a delay circuit in which inverters 60-1, 60-2, ..., 60-n are cascade-connected, a signal is applied to an input terminal 62 and a delay output is provided from an output terminal 64. By controlling voltages applied to the inverters 60-1 through 60-n by means of the control voltages Vc1 and Vc2, the delay time can be maintained at a constant value.

Figure 18:
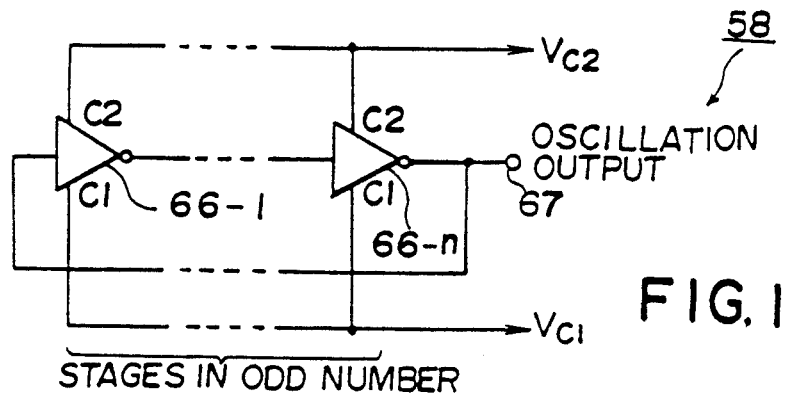

FIG. 18 shows a ring oscillator in which inverters 66-1, ..., 66-n are cascade-connected and an output of the inverter 66-n of the final stage is applied to the inverter 66-1 of the initial stage to produce an oscillation output from an output terminal 67. By controlling voltages applied to the inverters 66-1 through 66-n by the control voltages Vc1 and Vc2, the delay time of the inverters 66-1 through 66-n can be maintained at a constant value and the oscillation frequency can thereby be stabilized.

Figure 19:
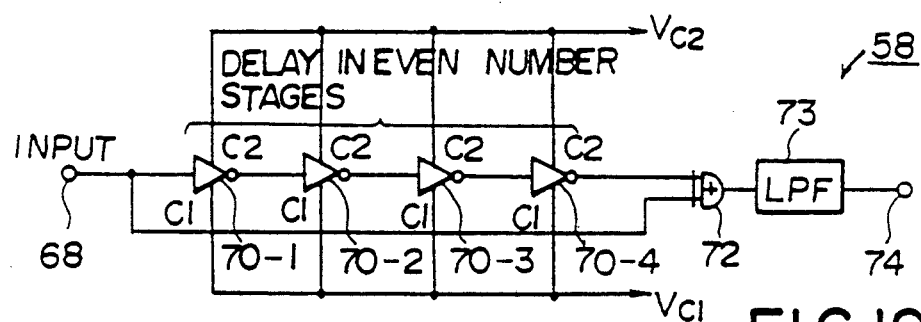

FIG. 19 shows an FM demodulation circuit (a pulse count detection circuit) which comprises cascade-connected inverters 70-1, 70-2, 70-3 and 70-4 of an even number (four in this example). A signal to be demodulated is applied to these inverters through an input terminal 68 and an output signal of the inverter 70-4 of the final stage is applied to an exclusive OR circuit 72. The output of the exclusive OR circuit 72 is taken out through a low-pass filter 73 and delivered to an output terminal 74 as a demodulated signal. An accurate demodulation with little distortion can be made by controlling voltages applied to the inverters 70-1 through 70-4 by the control voltages Vc1 and Vc2.

Figure 20:
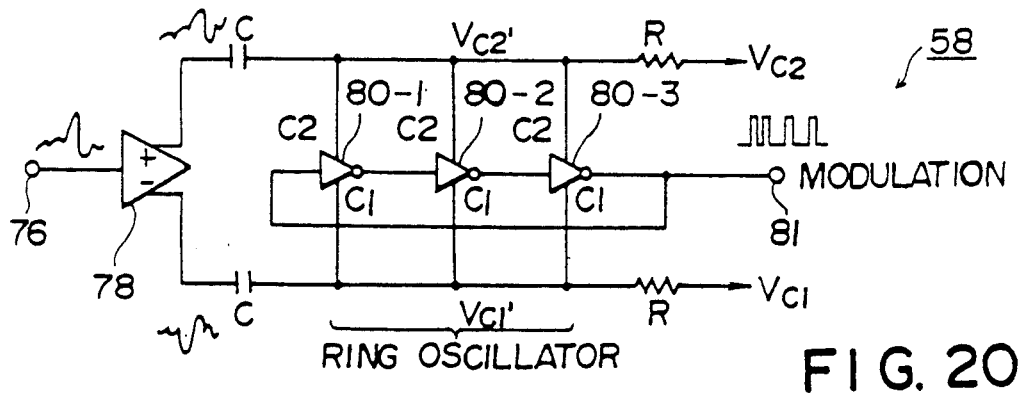

FIG. 20 shows an example of an FM modulation circuit. In this circuit, a signal to be modulated is applied from an input terminal 76 and supplied to an amplifier 78. Control voltages Vc1 and Vc2 are modulated by this input signal and the modulated control voltages Vc1' and Vc2' are used for controlling voltages applied to inverters 80-1, 80-2 and 80-3 constituting a ring oscillator whereby an FM modulated output is provided from the final stage inverter 80-3 to an output terminal 81. By the use of the above control voltages Vc1 and Vc2, an accurate modulation with little variation in the carrier frequency can be performed.

The respective CMOS inverters in FIGS. 17 through 20 can be constructed also as shown in FIGS. 1 and 7 through 15.

What is claimed:

1. A pulse count detection circuit comprising:
   (a) phase locked-loop means for producing a control signal including:
     a ring oscillator circuit including a first CMOS gate circuit having an input terminal to which a binary input signal to be delayed is applied and an output terminal, a first power voltage control means for controlling an operation power voltage applied to the first CMOS gate circuit thereby to control an amount of delay of the first CMOS gate circuit and a feedback path for connecting said output of said first CMOS gate circuit back to said input of said first CMOS gate circuit;
     reference signal generation means for generating a reference signal of constant frequency;
     comparison means for comparing the phase of said reference signal to the phase of the output of said first CMOS gate circuit; and
     control voltage generation means for generating a control signal in response to a result of the comparison of said comparator means and applying the generated control signal to control said first power voltage control means, thereby constituting a phase locked-loop so as to stabilize the frequency of the output of the ring oscillator circuit;
   (b) a second CMOS gate circuit to which a signal to be pulse count detected is applied, the second CMOS gate circuit forming a delay circuit and comprising an even number of CMOS gates in series, wherein the second CMOS gate circuit includes second power voltage control means for controlling an operation power voltage applied to the second CMOS gate circuit thereby to control an amount of delay of the second CMOS gate circuit, and wherein said control signal generated by the phase locked-loop means is applied to the second voltage control means to set the delay of the second CMOS gate circuit;
   (c) an exclusive OR gate having one input receiving an output from said second CMOS gate circuit and a second input receiving the signal to be pulse count detected; and
   (d) a lowpass filter circuit for receiving the output of said exclusive OR gate and outputting a signal as the output of the pulse count detection circuit.

2. A frequency modulation circuit comprising:
   (a) phase locked-loop means for producing a control signal, including:
     a ring oscillator circuit including a first CMOS gate circuit having an input terminal to which a binary input signal to be delayed is applied and an output terminal, a first power voltage control means for controlling an operation power voltage applied to the first CMOS gate circuit thereby to control an amount of delay of the first CMOS gate circuit and a feedback path for connecting said output of said first CMOS gate circuit back to said input of said first CMOS gate circuit;
     reference signal generation means for generating a reference signal of constant frequency;
     comparison means for comparing the phase of said reference signal to the phase of the output of said first CMOS gate circuit; and
     control voltage generation means for generating a control signal in response to a result of the comparison of said comparator means and applying the generated control signal to control said first power voltage control means of said first CMOS gate circuit, thereby constituting a phase locked-loop so as to stabilize the frequency of the output of the ring oscillator circuit;
   (b) a second CMOS gate circuit comprising plural stages of CMOS gates in a loop, wherein the second CMOS gate circuit includes second power voltage control means for controlling an operation power voltage applied to the second CMOS gate circuit thereby to control an amount of delay of the second CMOS gate circuit, wherein said control signal generated by the phase locked-loop means is applied to the second voltage control means; and
   (c) means for receiving a modulation input signal and applying a signal corresponding to the modulation input signal to the second control voltage means to modulate the operation power voltage applied to the second CMOS gate circuit, wherein a frequency modulated output is derived from a predetermined output of the CMOS gates.

3. A circuit as defined in claim 1, wherein said first and second CMOS gate circuits comprise a series of CMOS gates each including a pair of complementary MOS transistors with interconnected gates which receive a common input signal.

4. A circuit as defined in claim 2, wherein said first and second CMOS gate circuits comprise a series of CMOS gates each including a pair of complementary MOS tranistors with interconnected gates which receive a common input signal.

5. A circuit as defined in claim 3 wherein said CMOS gates of said first and second CMOS gate circuits are formed on a same substrate under a same environment.

6. A circuit as defined in claim 4 wherein said CMOS gates of said first and second CMOS gate circuits are formed on a same substrate under a same environment.

* * * * *